(12) United States Patent
Nagasawa et al.

(10) Patent No.: US 6,256,238 B1
(45) Date of Patent: Jul. 3, 2001

(54) SEMICONDUCTOR MEMORY DEVICE

(75) Inventors: Takayuki Nagasawa; Shinya Fujioka, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/610,856

(22) Filed: Jul. 6, 2000

(30) Foreign Application Priority Data

Aug. 20, 1999 (JP) ................................. 11-234157

(51) Int. Cl.[7] ....................................... G11C 8/00
(52) U.S. Cl. ............................................... 365/200
(58) Field of Search ................... 365/200, 201, 365/189.07

(56) References Cited

U.S. PATENT DOCUMENTS

| | | | |
|---|---|---|---|
| 4,752,914 | * 6/1988 | Nakano et al. | 365/200 |
| 5,596,535 | * 1/1997 | Mushya et al. | 365/200 |
| 5,680,354 | * 10/1997 | Kawagoe | 365/200 |

* cited by examiner

*Primary Examiner*—Tan T. Nguyen
(74) *Attorney, Agent, or Firm*—Arent Fox Kintner Plotkin & Kahn, PLLC

(57) ABSTRACT

A semiconductor memory device having memory cells, spare memory cells to replace defective memory cells and a decision block. The decision block has a plurality of groups, each of which decides whether an input address is an address which selects a memory cell in the defective memory cells. A signal having a different address expression type of the input address is provided to each of the groups.

7 Claims, 10 Drawing Sheets

SEMICONDUCTOR MEMORY DEVICE

BACKGROUND OF THE INVENTION

1. Field of the Invention

The present invention generally relates to a semiconductor memory device, and more particularly to selection circuits of spare memory cells, in which defective memory cells are replaced by spare memory cells to substantially remove defects from the semiconductor memory device.

2. Description of the Related Art

FIG. 1 shows a block diagram of a dynamic random access memory (DRAM) 100, in which a memory word having a defective memory cell is replaced by a spare memory word to substantially eliminate defective cells from a semiconductor memory device. The DRAM 100 mainly has a primary memory cell array 112, a redundant memory cell array 113, a data bus 114, an input/output circuit 115 and a word selection circuit 130. The word selection circuit 130 mainly includes an input buffer block 101 that receives an address signal 120, an input buffer block 102 that receives a command signal 121, a command decoder 103, a RAS (Row Address Strobe) main signal generation circuit 104, an address latch circuit 105, an address amplifier block 106, a pre-decode circuit 107, a primary word decoder 108, a row redundant address decision circuit 109, a redundant word decoder 110 and a word decoder trigger signal generation circuit 111. FIG. 2 shows a flow chart of selection of primary word lines of the primary memory cell array 112 and selection of redundant word lines for the redundant memory cell array 113 when an address signal 120 is supplied to the DRAM 100. First, the selection of both word lines as shown in FIG. 2 will be explained.

In FIG. 2, the address signal is supplied to the DRAM 100 as shown in FIG. 1 in a step S1. The supplied address signal is latched in a step S2 and amplified. Next, in the step S3, a row redundancy decision is made with regard to the amplified address signal. If the supplied address corresponds to the row address which selects the word line of the memory word including the defective memory cells, it is decided that the row redundancy operation is performed. Then, in the step S4, the redundant word decoder 110 as shown in FIG. 1 is selected. Then, the redundant word decoder 110 as shown in FIG. 1 is activated in a step S5 and the redundant word line RWL as shown in FIG. 1 is activated. On the other hand, if the supplied address does not correspond to the row address which selects the word line of a memory word that includes a defective memory cell, the row redundancy operation will not be made. Then, in the step S6, the primary word decoder 108 as shown in FIG. 1 is selected and in a step S7 the primary word line WL is activated.

Next, an operation of the DRAM 100 will be explained using FIG. 1. First, the address signal 120 is supplied to the input buffer 101. The address signal 120 is latched synchronously with an internal clock by the input buffer 101 and the address latch circuit 105, then the latched address signal is supplied to the address amplifier block 106. On the other hand, the command signal 121 is also supplied to the input buffer 102. Then, the command signal 121 is latched synchronously with the internal clock by the input buffer 102 and is supplied to the command decoder 103. The command decoder decodes the command and generates various signals needed for following circuit operations. Some of output signals from the command decoder 103 are supplied to the RAS main signal generation circuit 104. The RAS main signal generation circuit 104 generates various main signals needed for the row address circuits, such as the row redundant address decision circuit 109, to operate. The address latch signal needed for the address amplifier block 106 to latch the address is also generated by the RAS main signal generation circuit 104.

In the address amplifier block 106, the address signal is latched using the latch signal generated by the RAS main signal generation circuit 104 and amplified. An amplified internal address signal AD is supplied to both the pre-decode circuit 107 and the row redundant address decision circuit 109. The internal address signal AD supplied to the row redundant address decision circuit 109 is further send to the redundant word decoder 110 as a redundant address signal RA. The internal address signal AD supplied to the pre-decode circuit 107 is pre-decoded, and then, a pre-decoded internal address signal is sent to the primary word decoder 108.

Next, the row redundant address decision circuit 109 decides whether the supplied internal address AD corresponds to the row address which selects the word line of a memory word that includes a defective memory cell and sends a result of the decision to the word decoder trigger signal generation circuit 111. The word decoder trigger signal generation circuit 111 selects either the redundant word decoder 110 or the primary word decoder 108. If the result of the selection is, for example, HIGH, then the redundant word decoder 110 is selected through a trigger signal TR1 and the redundant word line RWL is activated. As a result, the memory cell in the redundant memory cell array 113 is selected and data 123 is written to or read from the redundant memory cell through the input/output circuit 115. On the other hand, if the result of the selection is, for example, LOW, then the primary word decoder 108 is selected through a trigger signal TR2 and the primary word line WL is activated. As a result, the memory cell in the primary memory cell array 112 is selected and the data 123 is written to or read from the primary memory cell through the input/output circuit 115.

FIG. 3 shows an example of an address amplifier for one address line. The address amplifier mainly has inverters 301, 303, 304, 305 and 306 and a switch 302. When a latch signal 311 is HIGH, the switch 302 has a conduction (ON) state. Therefore, an input address signal 310 is output from the switch 302. When the input address signal 310 is HIGH, the HIGH level signal is output from the switch 302 and an output of the inverter 303 becomes LOW. Then, an output of the inverter 304 becomes HIGH. As a result, the LOW level is held at the output of the inverter 303 after the latch signal 311 becomes LOW and the switch 302 becomes off-state. An internal address signal 312 is output from the inverter 306 through the inverters 305.

FIG. 4 shows a connection between the address amplifier and the row redundant address decision circuits according to the prior art. Especially, FIG. 4 shows the connection between the output of one address amplifier 300 and the inputs of the row redundant address decision circuits 401 to 404 for one input address line. As shown in FIG. 4, the output of the address amplifier 300 is connected to all the inputs of the row redundant address decision circuits 401 to 404.

FIG. 5 shows the connection between the address amplifier 300 and the row redundant address decision circuits 401 and 403 as shown in FIG. 4. In the row redundant address decision circuit group 109 as shown in FIG. 4, there exists one row redundant address decision circuit B 403 corresponding to a row redundant address decision circuit A 401 having an inverter 501 at its input. This is because there are two cases, as follows. One case is that the input address becomes a redundant address when the output of the address amplifier 300 is HIGH. Another case is that the input address becomes the redundant address when the output of the address amplifier 300 is LOW. Therefore, the row redundant address decision circuit B 403 consists of the row redundant address decision circuit A 401 and the inverter 501 connected to the input of the row redundant address decision circuit A 401.

However, in the prior art described above, there is a disadvantage that the address amplifier is overloaded because the output of the address amplifier is connected to all the row redundant address decision circuits. This results in a slow operation speed of the semiconductor memory device.

SUMMARY OF THE INVENTION

It is a general object of the present invention to provide a semiconductor memory device, from which the above disadvantages are eliminated.

A more specific object of the present invention is to provide a semiconductor memory device, in which the speed of operation of the semiconductor memory device is improved by reducing the load seen by each of the address amplifier.

The above objects of the present invention are achieved by a semiconductor memory device having memory cells, spare memory cells to replace defective memory cells and a decision block. The decision block has a plurality of groups, each of which decides whether an input address is an address which selects a memory cell in the defective memory cells. A signal having a different address expression type of the input address is provided to each of the groups.

According to the invention, it is possible to reduce the load of the address amplifier because a separate address signal is supplied to each decision group. Therefore, the operation speed of the semiconductor memory device can be improved.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Next, an embodiment according to the present invention will be explained.

Figure 1:
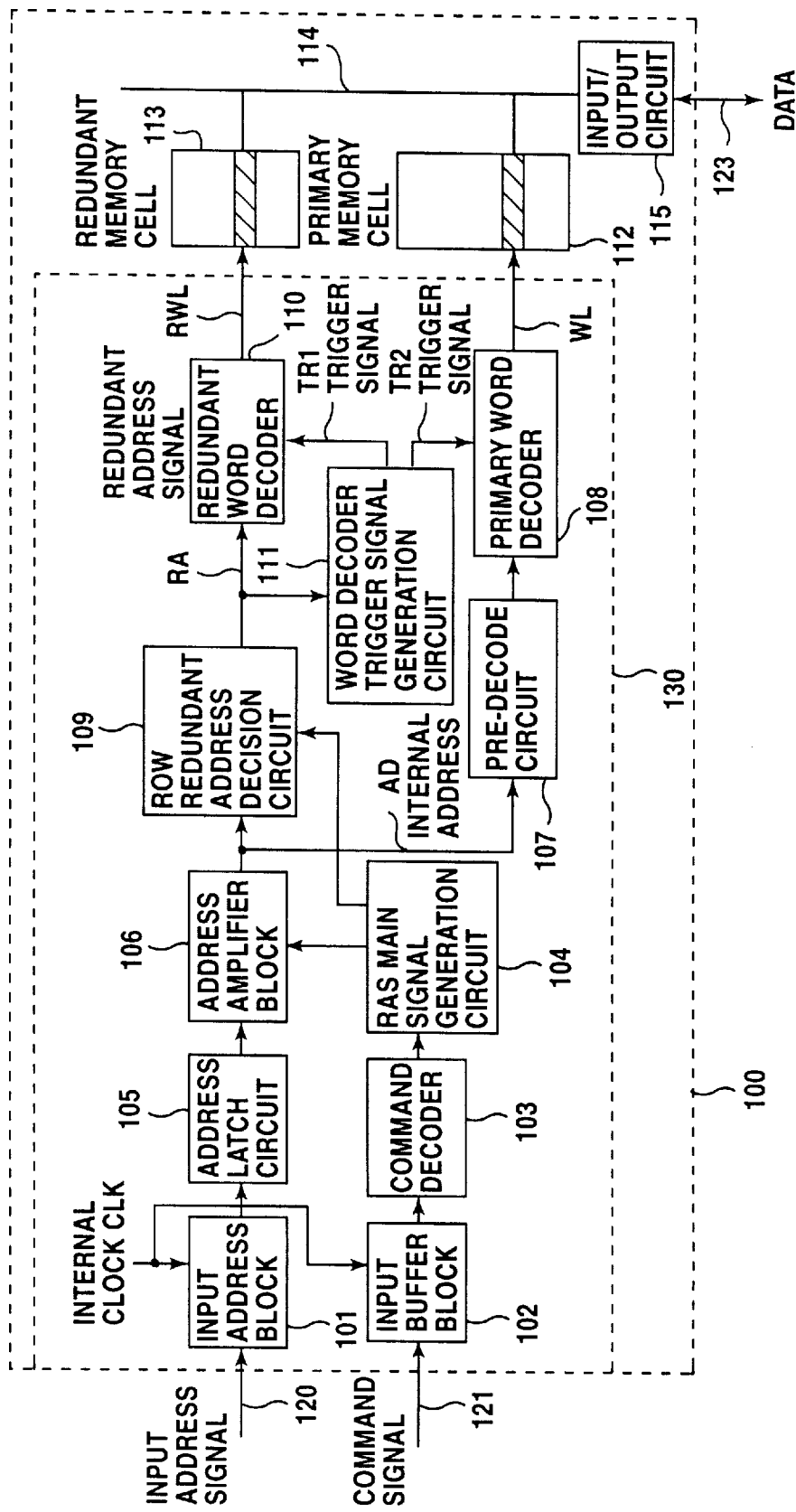
FIG. 1 shows a block diagram of a dynamic random access memory (DRAM)
Figure 2:
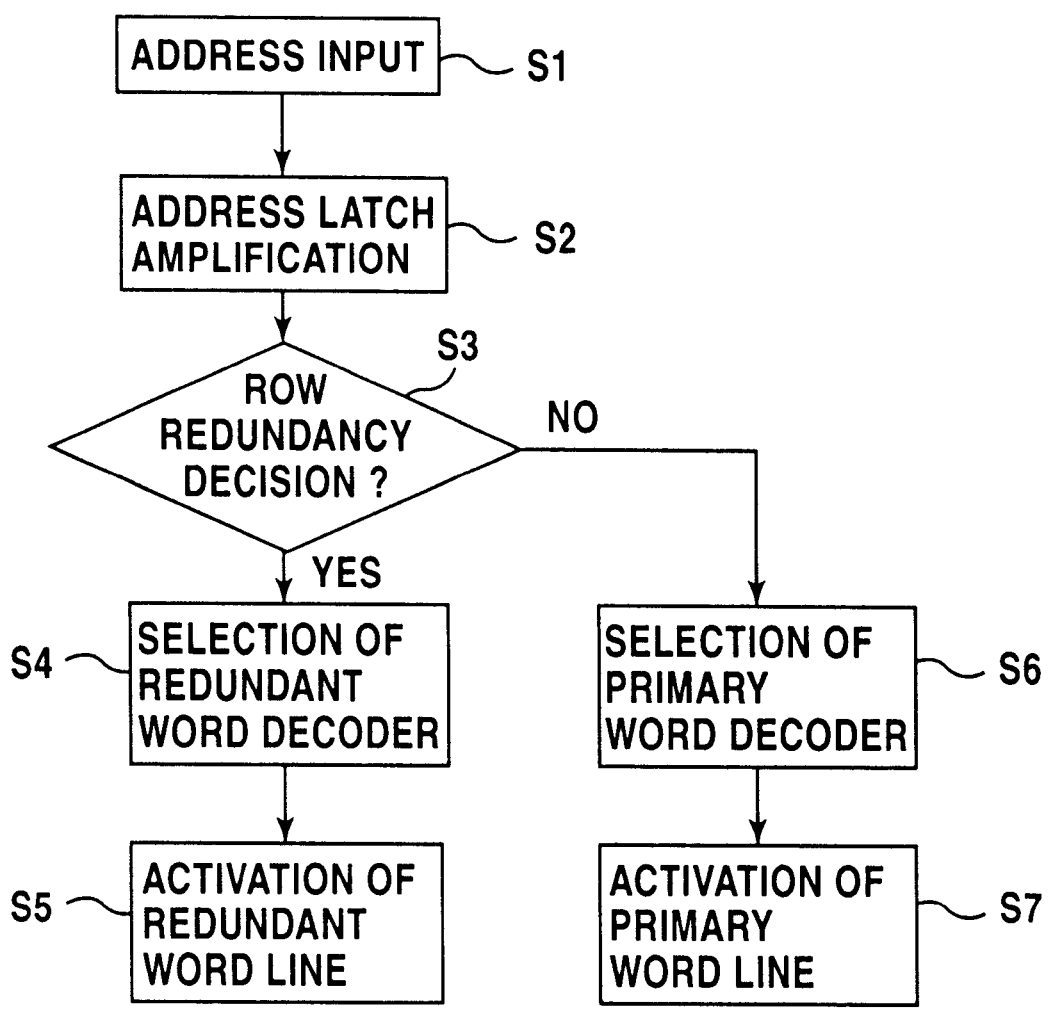
FIG. 2 shows a flow chart of selection of word lines according to the prior art.
Figure 6:
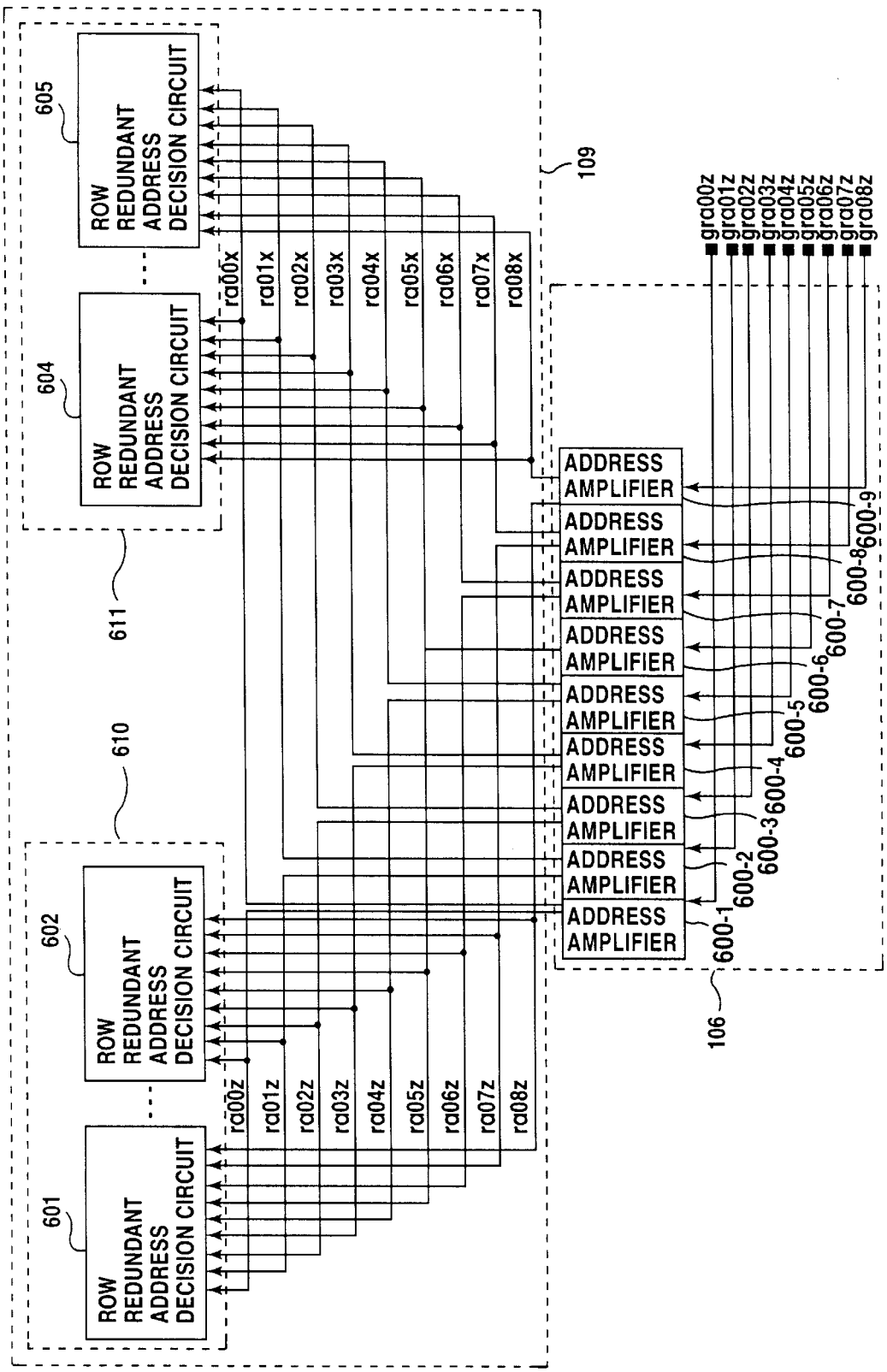
FIG. 6 shows an embodiment of the present invention.

FIG. 6 shows an embodiment of the present invention. FIG. 6 shows details of the connection between the address amplifier block 106 and the row redundant address decision circuit 109 shown in FIG. 1. In FIG. 6, each of signals gra00z to gra08z corresponds to a different bit of the row address supplied by the address latch circuit 105 to the address amplifier block 106 as shown in FIG. 1. Each of the address amplifiers 600-1 to 600-9 of the address amplifier block 106 is provided with a different one of the signals gra00z to gra08z, respectively. Each of the address amplifiers 600-1 to 600-9 generates both an address signal having the same polarity as the input row address signal and another address signal having the opposite polarity as that signal of the input row address signal. For example, the address amplifier 600-1 receives the row address signal gra00z from the address latch circuit 105 and generates both an internal row address signal ra00x having the same polarity as the row address signal gra00z and another internal address signal ra00z having the opposite polarity as the row address signal gra00z.

The row redundant address decision circuit 109 has a first row redundant address decision group 610 and a second row redundant address decision group 611. The internal row address signals ra00z to ra08z which have the opposite polarity with the signals gra00z to gra08z supplied from the address latch circuit 105 are supplied to the first row redundant address decision group 610 from the address amplifiers 600-1 to 600-9. On the other hand, the internal row address signals ra00x to ra08x which have the same polarity as the signals gra00z to gra08z are supplied to the second row redundant address decision group 611 from the address amplifiers 600-1 to 600-9. The first row redundant address decision group 610 has row redundant address decision circuits 601 and 602. The row redundant address decision circuits 601 and 602 decide whether the row address of gra00z to gra08z corresponds to the row address which selects the word line of the memory word including the defective memory cells using the inverted internal row address signals ra00z to ra08z. On the other hand, the second row redundant address decision group 611 has row redundant address decision circuits 604 and 605. The row redundant address decision circuits 604 and 605 decide whether the row address of gra00z to gra08z corresponds to the row address which selects the word line of the memory word including the defective memory cells using the non-inverted internal row address signals ra00x to ra08x.

As mentioned above, the decision whether the row address of gra00z to gra08z corresponds to the row address which selects the word line of the memory word including the defective memory cells is made by the first row redundant address decision group 610 only based on the internal address signals having the opposite polarity as the input address signals and the decision made by the second row redundant address decision group 611 is only based on the internal address signals having the same polarity as the input address signals.

Therefore, the load seen by each of the amplifiers that drives the row redundant address decision circuits is half that seen by an amplifier that drives a conventional row redundant address circuit, so that the operation speed of the address signal is improved. As a result, the operation speed of the semiconductor memory device is also improved.

Figure 3:
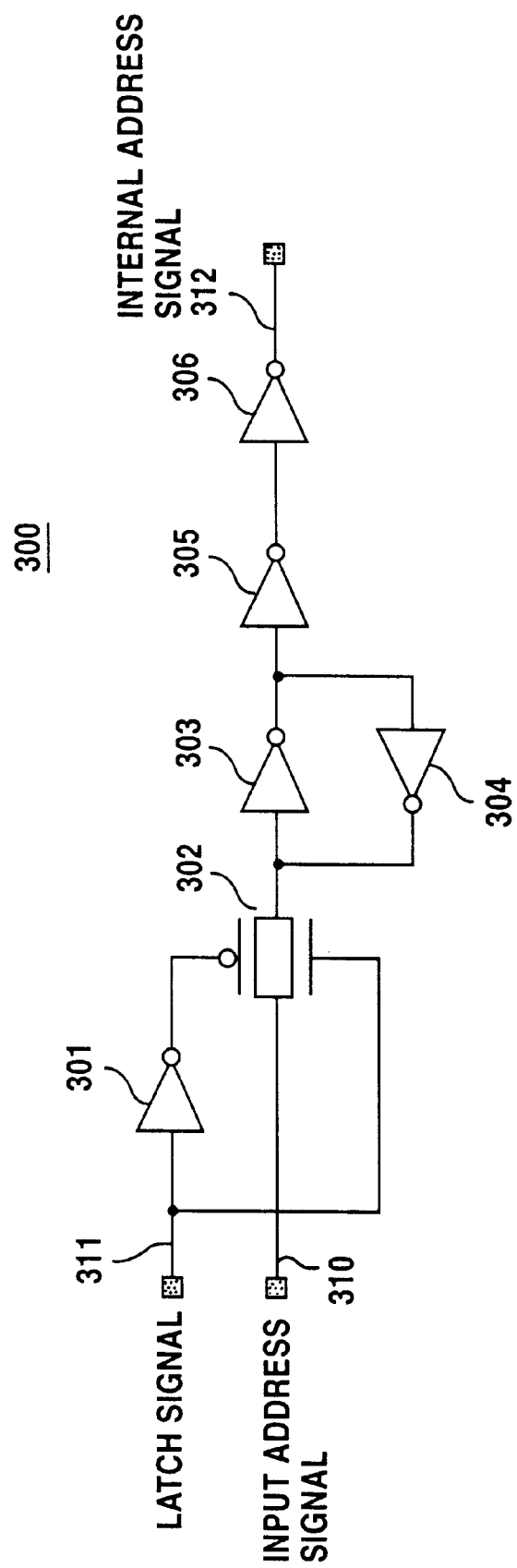
FIG. 3 shows a conventional address amplifier.
Figure 4:
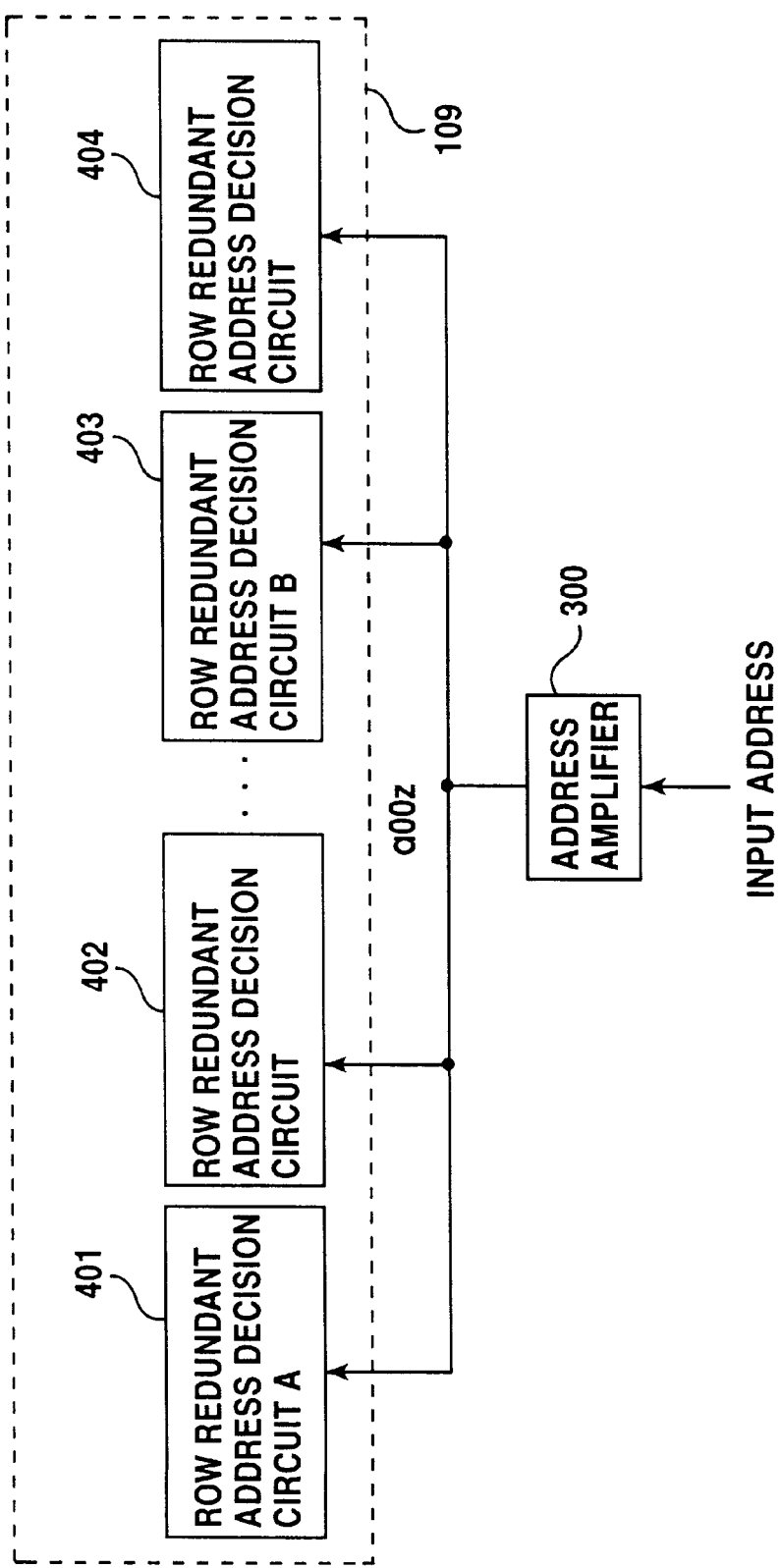
FIG. 4 shows a connection between the address amplifier and row redundant address decision circuits according to the prior art.
Figure 5:
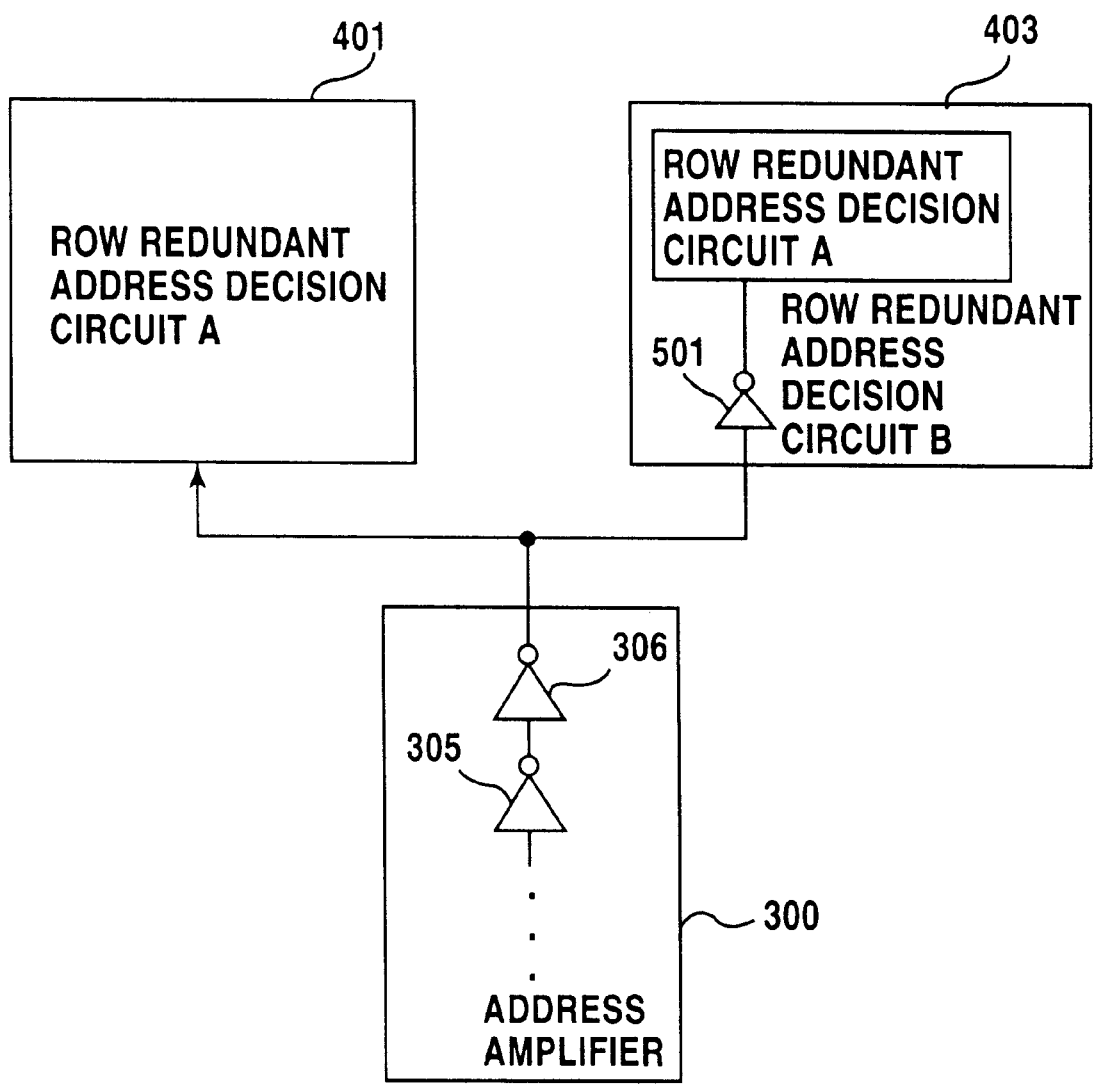
FIG. 5 shows the connection between the address amplifier 300 and row redundant address decision circuits 401 and 403 according to the prior art.
Figure 7:
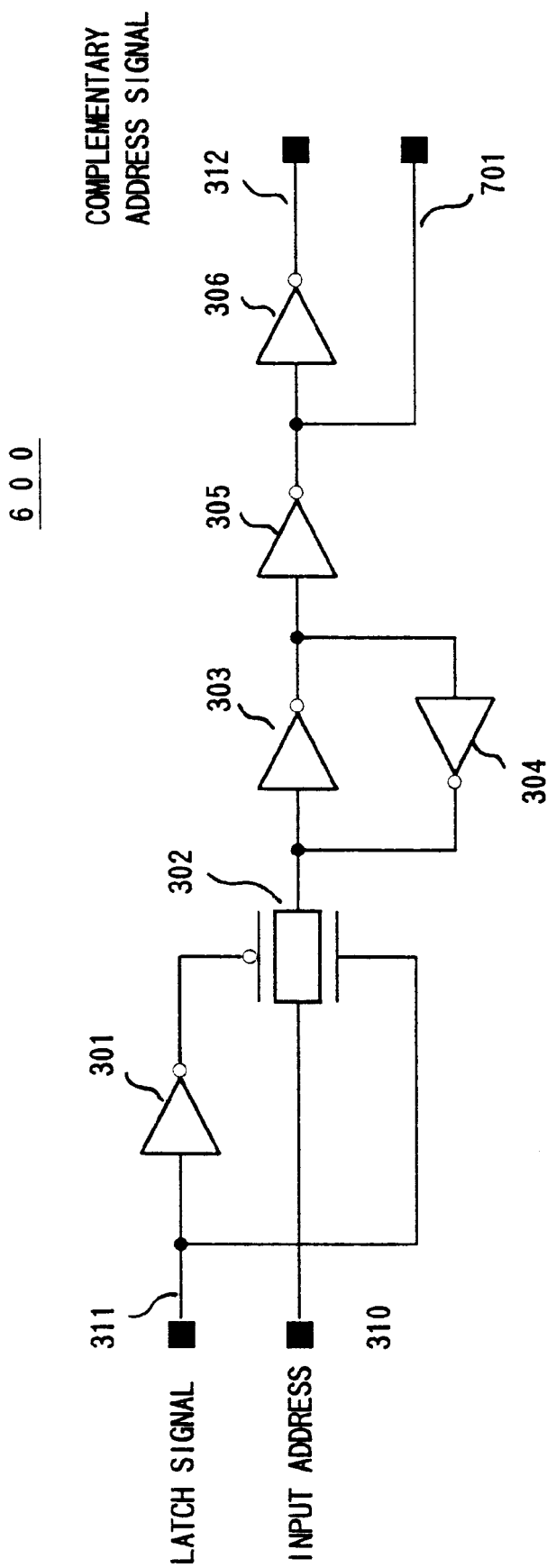
FIG. 7 shows an embodiment of an address amplifier circuit according to the present invention.

Next, an embodiment of the address amplifier 600-1 of the present invention will be explained. FIG. 7 shows an embodiment of the circuit of the address amplifier 600-1 according to the present invention. Any element as shown in FIG. 7 having the same reference numeral as shown in FIG. 3 is the same element. A difference between the address amplifier as shown in FIG. 3 and the address amplifier as shown in FIG. 7 is that, in FIG. 7, both the address signal 701 having the same polarity as the input address signal and the complementary address signal 312 having the opposite polarity with the input address signal are output from the address amplifier. For example, in FIG. 6, the output ra00x of the address amplifier 600-1 corresponds to the address signal 701 as shown in FIG. 7 having the same polarity as the input address signal and the output ra00z of the address amplifier 600-1 corresponds to the address signal 312 as shown in FIG. 7 having the opposite polarity with the input address signal.

Figure 8:
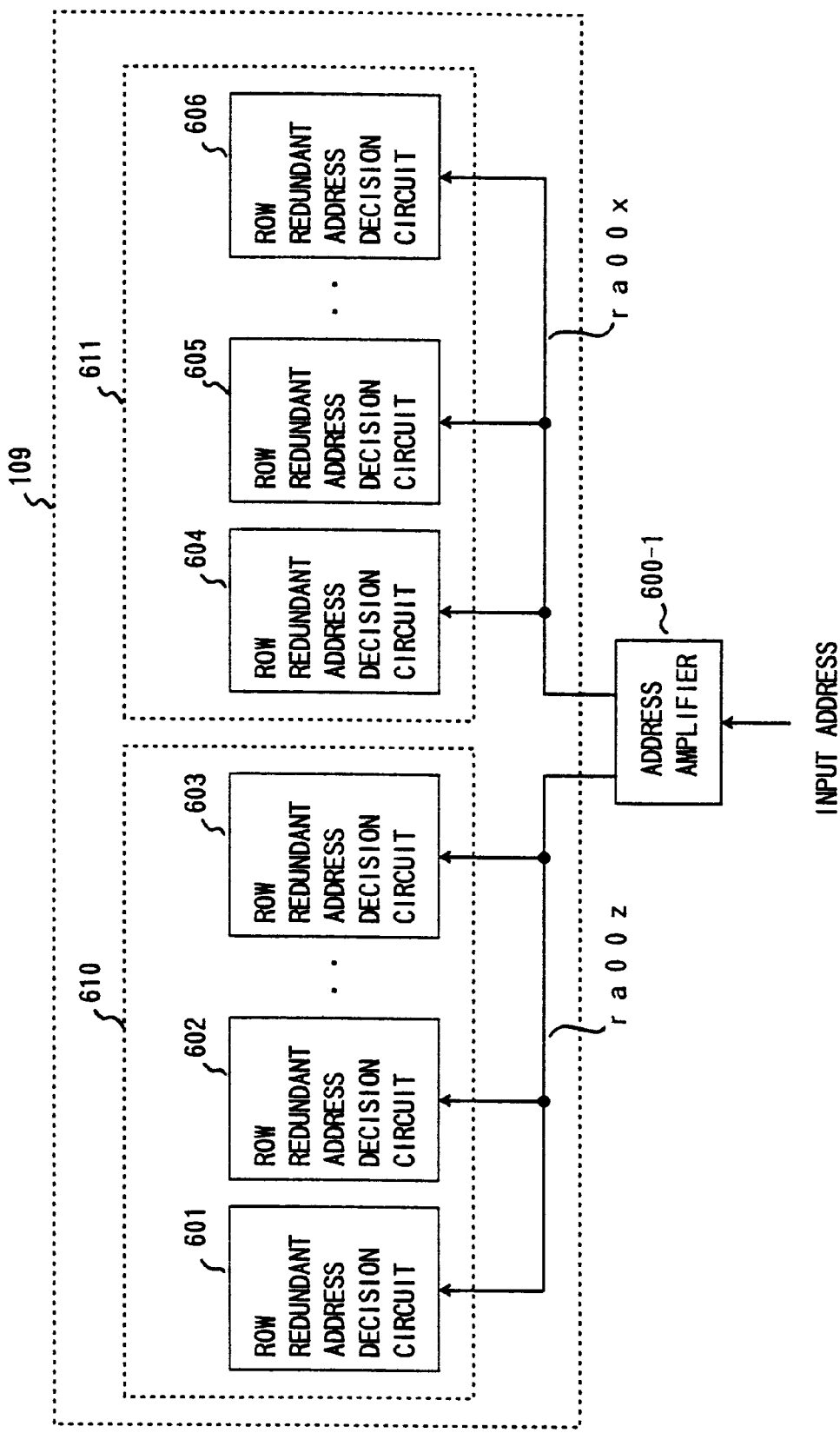
FIG. 8 shows the row redundant address decision circuits connected the address amplifier 600-1 according to the present invention.

FIG. 8 shows the row redundant address decision circuits connected to the address amplifier 600-1 as shown in FIG. 6. The inverted address signal ra00z from the address amplifier 600-1 is supplied to each of the input of the row redundant address decision circuits 601 to 603 and the noninverted address signal ra00x from the address amplifier 600-1 is supplied to each of the inputs of the row redundant address decision circuits 604 to 606.

Figure 9:
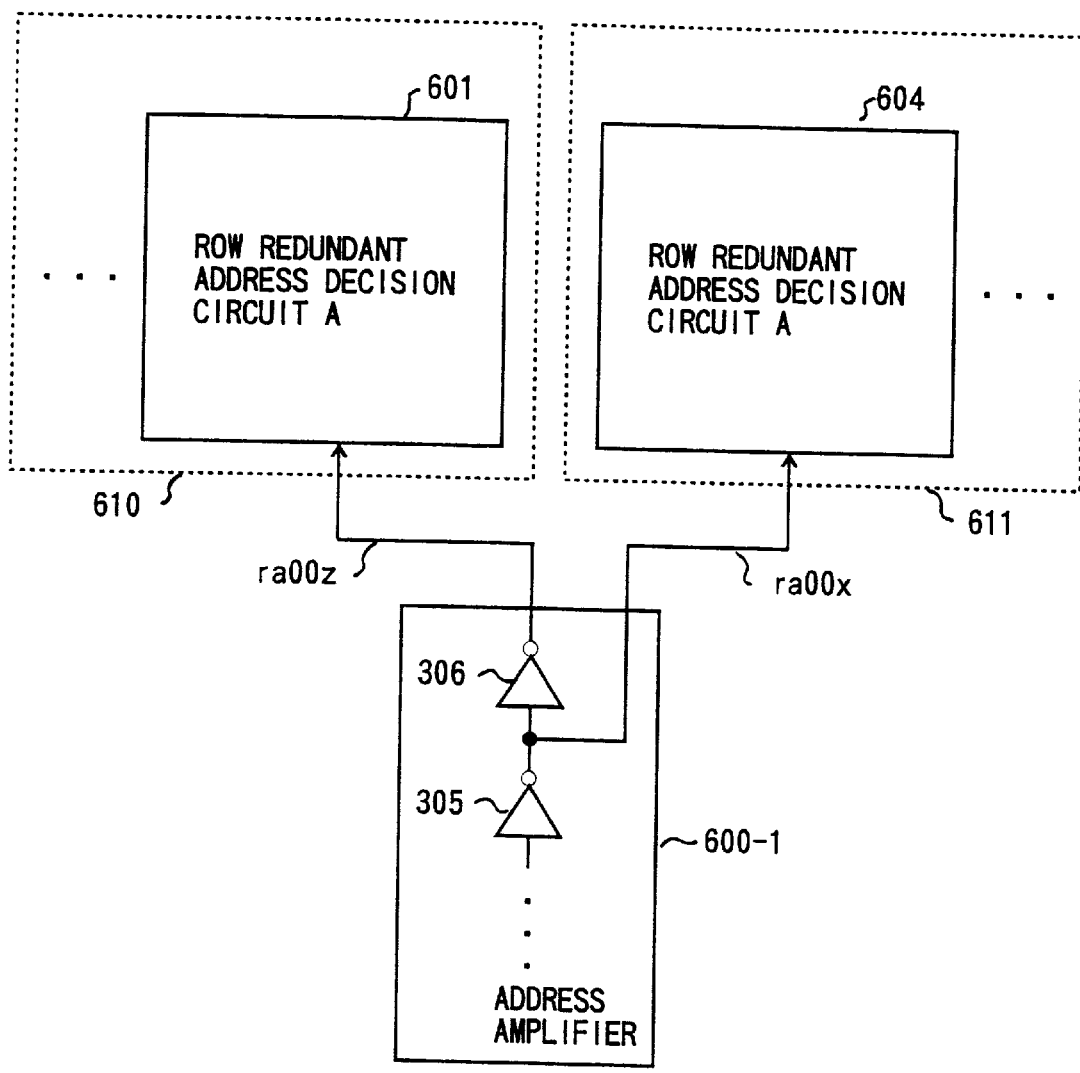
FIG. 9 shows the connection between the address amplifier 600-1 and the row redundant address decision circuits 601 and 604 according to the present invention.

FIG. 9 shows the connection between the address amplifier 600-1 and the row redundant address decision circuits 601 and 604. The row redundant address decision circuit 601 which is supplied the inverting address signal ra00z from the inverter 306 in the address amplifier 600-1 and the row redundant address decision circuit 604 which is supplied the non-inverting address signal ra00x from the inverter 305 in the address amplifier 600-1 have the same configuration. When the decision whether the input address corresponds to the row address which selects the word line of the memory word including the defective memory cells is made, then the redundant address is selected by the row redundant address decision circuit 601 if the input address signal gra00z of the amplifier 600-1 is HIGH. On the other hand, if the input address signal gra00z of the amplifier 600-1 is LOW, then the redundant address is selected by the row redundant address decision circuit 604. As mentioned above, the complementary addresses are supplied to the row redundant address decision circuits 601 and 604, respectively. Therefore, it is possible to detect the address corresponds to the row address which selects the word line of the memory word including the defective memory cells using the row redundant address decision circuits 601 and 604 which have the same configuration.

Figure 10:
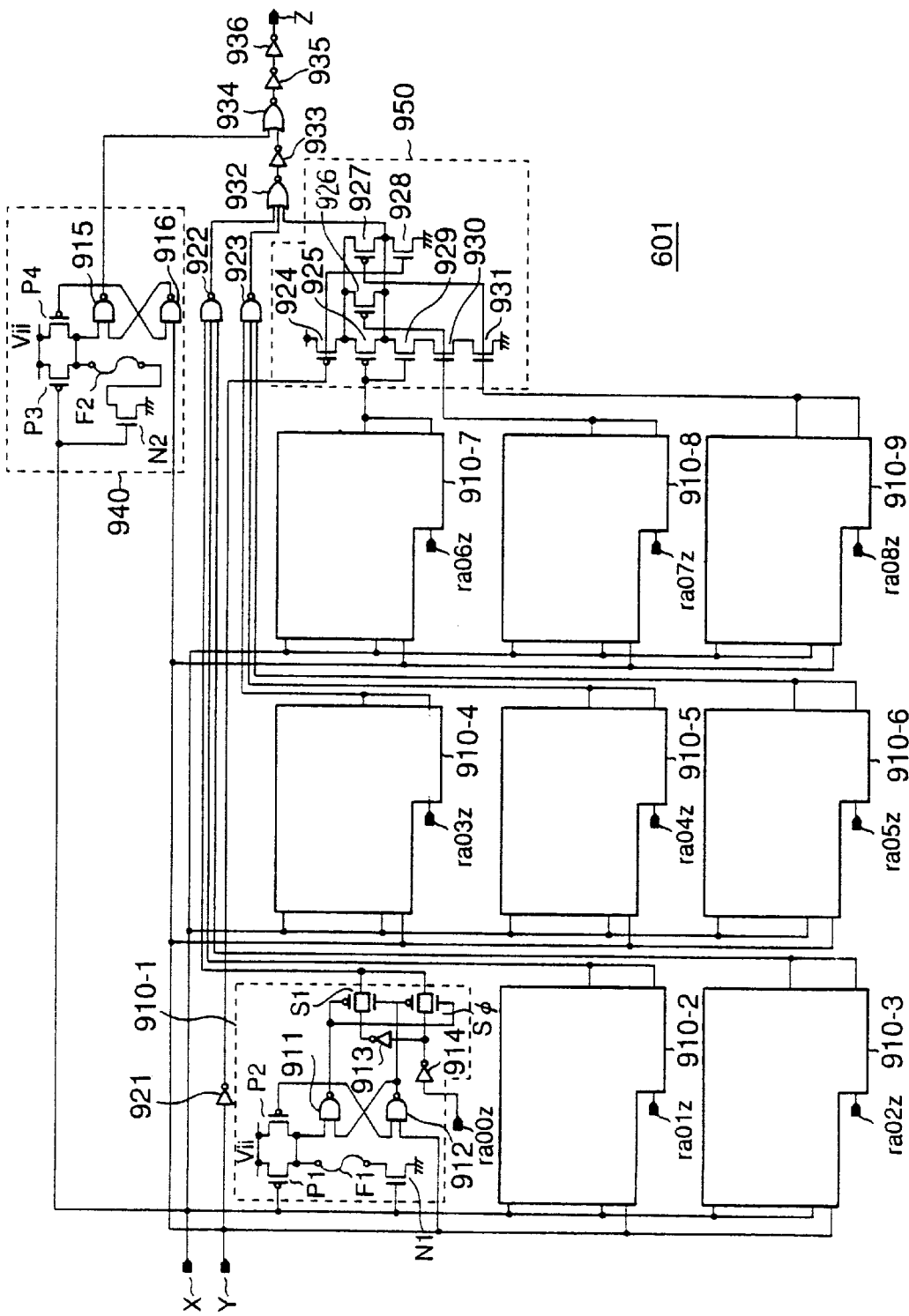
FIG. 10 shows an embodiment of the row redundant address decision circuit according to the present invention.

Next, an embodiment of the row redundant address decision circuit according to the present invention will be explained. FIG. 10 shows the embodiment of the row redundant address decision circuit 601.

The row redundant address decision circuit 601 mainly has address bit comparators 910-1 to 910-9 and a redundancy operation control circuit 940. The address bit comparator 910-1 has PMOS transistors P1 and P2, NMOS transistor N1, NAND gates 911 and 912, switches S0 and S1, inverters 913 and 914, and a fuse F1. The address bit comparator 910-1 compares a value of the address bit ra00z with a state determined by the fuse F1. When the value of the address bit ra00z is equal to the value determined by the fuse F1, then the address bit comparator 910-1 outputs HIGH level. On the other hand, when the value of the address bit ra00z is not equal to the value determined by the fuse F1, then the address bit comparator 910-1 outputs LOW level.

When the defects in the primary memory cells are detected during production of the semiconductor memory device, the fuse F1 is blown for the address which selects the word line of the memory word including the defective memory cells. Next, the operation of the address bit comparator 910-1 will be explained.

First, a case in which the fuse F1 is not blown will be explained.

When signals X and Y becomes LOW level, the drain of the PMOS transistor P1 becomes a HIGH level and simultaneously one input of the NAND gate 912 becomes LOW level. As a result, the output of the NAND gate 912 becomes the HIGH level and the output of the NAND gate 911 becomes the LOW level. If the signal Y changes from the LOW level to the HIGH level, the output of the NAND gate 911 and the output of the NAND gate 912 are unchanged, so that the switch S1 is closed and the switch S0 is open.

If the signal X changes from LOW level to the HIGH level, the NMOS transistor N1 conducts and an input of the NAND gate 911, which is connected to the drain of the PMOS P2, becomes the LOW level. As a result, the output of the NAND gate 911 becomes the HIGH level and the output of the NAND gate 912 becomes the LOW level. In this state, the switch S0 is closed and the switch S1 is open. When the address signal ra00z has the HIGH level, the LOW level is output from the output of the switch S0. On the other hand, when the address signal ra00z has the LOW level, the HIGH level is output from the output of the switch S0 because the inverter 914 inverts the address signal ra00z. As mentioned above, in case that the fuse F1 is not blown, the HIGH level is output from the switch S0 when the address signal ra00z is LOW. This means that the address bit comparator 910-1 compares the address signal ra00z with the LOW level when the fuse F1 is not blown.

Next, another case in which the fuse F1 is blown will be explained. When the address signal ra00z has the HIGH level, the switch S1 outputs the HIGH level through the inverters 913 and 914. This means that the address bit comparator 910-1 compares the address signal ra00z with the HIGH level when the fuse F1 is blown.

Other address bit comparators 910-2 to 910-9 compare the address signals with either the HIGH level or LOW level in the same way as the address bit comparator 910-1. The outputs of the address bit comparators 910-1 to 910-9 are supplied to the NAND gates 922 and 923 and to a gate circuit 950.

The gate circuit 950 has PMOS transistors 924, 925, 926 and 927 and NMOS transistors 928, 929, 930 and 931. A three-input NAND gate is constructed by the PMOS transistors 925, 926 and 927 and the NMOS transistors 929, 930 and 931. The PMOS transistor 924 and the NMOS transistor 928 activate the gate circuit 950 when the signal Y becomes HIGH level. The output signals of the NAND gates 922 and 923 and a gate circuit 950 are supplied to an input of the NOR gate 932 and an output of the NOR gate 932 is supplied to an input of the inverter 933.

When the output of each of the address bit comparators 910-1 to 910-9 is HIGH, (i.e., the input of each of the address bit comparators 910-1 to 910-9 matches values determined by the fuses), the output of the inverter 933 becomes LOW level.

Next, the redundancy operation control circuit 940 will be explained. The redundancy operation control circuit 940 has PMOS transistors P3 and P4, an NMOS transistor N2, NAND gates 915 and 916 and a fuse F2. As described above for the address bit comparators 910-1, the output of the NAND gate 915 becomes HIGH when the fuse F2 is not blown and the output of the NAND gate 915 becomes LOW when the fuse F2 is blown. When the fuse is blown, the redundancy operation is executed.

When input of each of the address bit comparators 910-1 to 910-9 matches the value determined by the fuses, (i.e., the output of each of the address bit comparators 910-1 to 910-9 is HIGH) and the fuse F2 is blown, an output Z of the inverter 936 becomes HIGH. As a result, the redundancy operation will be executed. On the other hand, when one or more of the input signals of the address bit comparators 910-1 to 910-9 does not match the value determined by the fuses or the fuse F2 is blown, the output Z of the inverter 936 becomes LOW. As a result, the redundancy operation is not executed.

The present invention is not limited to the specifically disclosed embodiments, and variations and modifications may be made without departing from the scope of the present invention.

The present application is based on Japanese Patent Application No. 11-234157, filed on Aug. 20, 1999, the entire contents of which are hereby incorporated by reference.

What is claimed is:

1. A semiconductor memory device, comprising:

memory cells;

redundant memory cells to replace defective memory cells in the memory cells;

an address buffer to output an address bit and an inverted address bit;

a first redundant address decision circuit receiving said address bit and not receiving said inverted address bit to detect that said address bit corresponds to address of one of said redundant memory cells; and a second redundant address decision circuit receiving said inverted address bit and not receiving said address bit to detect that said inverted address bit corresponds to address of another of said redundant memory cells.

2. A semiconductor memory device comprising:

memory cells;

spare memory cells to replace defective memory cells in said memory cells;

a first decision block which decides whether an input address is an address which selects one of said defective memory cells using said input address;

a second decision block which decides whether said input address is the address which selects one of said defective memory cells using an inverted address, each bit of which is an inversion of each bit of said input address.

3. A semiconductor memory device as claimed in claim 2, wherein said first decision block and said second decision block have the same configuration.

4. A semiconductor memory device comprising:

memory cells;

spare memory cells to replace defective memory cells in said memory cells;

an address amplifier block having a plurality of amplifiers, each of which amplifies one of a plurality of bit signals of an input address;

a redundant address decision block which decides whether an input address is an address which selects one of said defective memory cells, wherein each of said address amplifiers in said address amplifier block supplies signals having different address expression types of said input address to said redundant address decision block.

5. A semiconductor memory device as claimed in claim 4, wherein said signals having different address expression types of said input address are complementary address signals of said input address.

6. A semiconductor memory device as claimed in claim 5, wherein said redundant address decision block has a first redundant address decision block and a second redundant address decision block, wherein one of said complementary address signals is supplied to one of said first redundant address decision block and said second redundant address decision block and another of said complementary address signals is supplied to another of said first redundant address decision block and said second redundant address decision block.

7. A semiconductor memory device as claimed in claim 6, wherein said first redundant address decision block and said second redundant address decision block have the same configuration.

* * * * *